(12) United States Patent
Chung et al.

(10) Patent No.: US 7,916,277 B2
(45) Date of Patent: Mar. 29, 2011

(54) EXPOSING APPARATUS HAVING SUBSTRATE CHUCK OF GOOD FLATNESS

(75) Inventors: Hee-Uk Chung, Gyeongsangbuk-Do (KR); Sang-Hwan Cha, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 238 days.

(21) Appl. No.: 11/443,509

(22) Filed: May 30, 2006

(65) Prior Publication Data

US 2007/0008513 A1     Jan. 11, 2007

(30) Foreign Application Priority Data

May 30, 2005   (KR) .................. 10-2005-0045802

(51) Int. Cl.
*G03B 27/58*     (2006.01)
(52) U.S. Cl. ........................... 355/72; 355/53
(58) Field of Classification Search .............. 355/53, 355/72, 75
See application file for complete search history.

(56) References Cited

U.S. PATENT DOCUMENTS 5,806,193 A * 9/1998 Ebihara ............... 33/1 M
2001/0052970 A1* 12/2001 Sato .................... 355/72

FOREIGN PATENT DOCUMENTS

| JP | 63-131535 | 6/1988 |
| JP | 01-309325 | 12/1989 |
| JP | 09-068805 | 3/1997 |
| JP | 09-219357 | 8/1997 |
| JP | 10-112493 | 4/1998 |
| JP | 2003-015310 | 1/2003 |
| JP | 2004153094 A * | 5/2004 |
| JP | 2004-347883 | 12/2004 |
| JP | 2005-5623 | 1/2005 |
| TW | 518704 B | 1/2003 |
| TW | 575937 B | 2/2004 |

OTHER PUBLICATIONS

First Office Action issued in corresponding Chinese Patent Application No. 2006100834884; issued Mar. 28, 2008.
Office Action issued in corresponding Taiwanese Patent Application No. 95118780; issued Jul. 30, 2009.
Office Action issued in corresponding Japanese Patent Application No. 2006-149760; mailed Jul. 15, 2009.

* cited by examiner

*Primary Examiner* — Hung Henry Nguyen
*Assistant Examiner* — Steven H Whitesell-Gordon
(74) *Attorney, Agent, or Firm* — Brinks Hofer Gilson & Lione

(57) ABSTRACT

An exposing apparatus maintains uniformly a gap between a substrate and a mask stage. The substrate is disposed on a substrate chuck and the substrate chuck is supported by gap motors and air cylinders. The gap motors control the gap between the substrate and the mask stage and the air cylinders support the deflect portion of the substrate chuck to maintain the flatness of the whole area of the substrate.

10 Claims, 5 Drawing Sheets

EXPOSING APPARATUS HAVING SUBSTRATE CHUCK OF GOOD FLATNESS

The present application claims the benefit of Korean Patent Application No. 45802/2005 filed in Korea on May 30, 2005, which is hereby incorporated by reference.

FIELD

The present invention relates to a proximity type exposing apparatus, and more particularly, to a proximity type exposing apparatus having a flatness maintaining unit capable of maintaining a flatness of a large glass substrate and a flatness of a substrate chuck for supporting the glass substrate.

BACKGROUND

In order to fabricate a semiconductor device or a liquid crystal display (LCD) device, a process for forming a plurality of thin films is required. The thin film forming process is mainly performed by exposing technique, photolithography technique. Ultraviolet rays or X-rays are irradiated onto a substrate through a mask having a certain pattern thus to expose a photo-sensitive material deposited on the substrate, thereby forming the certain pattern on the substrate.

The exposing technique is utilized to pattern gate lines, data lines, and unit pixels of a liquid crystal display (LCD) device, and to form a color filter layer of a color filter substrate. Therefore, the exposing apparatus is very important in forming a precise pattern on the substrate.

Generally, the exposing apparatus is largely divided into a projection type for extraction/enlarge-transferring a mask pattern onto a substrate, and a proximity type for transferring a pattern onto a substrate by one to one using horizontal type parallel light.

The projection type exposing apparatus that can perform a contraction exposure is mainly used to fabricate a device requiring an integration such as a semiconductor device, and the proximity type exposing apparatus using a large mask is mainly used to fabricate an LCD device or a PDP having a large area on which same patterns are formed.

In the proximity type exposing apparatus, a mask has to be close to a substrate in order to completely transfer a mask pattern onto the substrate. In this case, the mask can come in contact with the substrate, which is called a contact type exposing apparatus. However, in case of the contact type exposing apparatus, foreign materials of the substrate may damage the mask. Therefore, it is a task to fabricate a mask stage proximate to a substrate without contact in the proximity type exposing apparatus.

The proximity type exposing apparatus and the projection type exposing apparatus respectively comprise a lighting device for generating light for exposure, a mask stage for supporting a mask having a certain pattern, a substrate chuck on which a substrate onto which the mask pattern is to be transferred is placed, and a supporter for supporting the substrate chuck.

The exposing apparatus is provided with a plurality of alignment cameras for certifying each position of the substrate and the mask stage in order to correctly align the substrate and the mask stage so as to precisely transfer the mask pattern onto the substrate. The alignment cameras correctly align the substrate and the mask stage by recognizing alignment keys formed on the substrate chuck or the substrate.

Accordingly as size of an LCD device is increasing recently, a mask stage for supporting a mask also becomes larger. A mask is fixed to a lower portion of the mask stage by a fixing means so that the mask can be proximate to a substrate.

The proximity type exposing apparatus will be explained with reference to FIG. 1.

Referring to FIG. 1, the proximity type exposing apparatus comprises a lighting device 101, a mask stage 105 formed at a lower portion of the lighting device 101 for supporting the mask 110, a supporter 120 for supporting four edges of the mask stage, a substrate chuck 130 formed at a lower portion of the mask stage 105 for supporting a substrate 114, a Y-axis driving stage 113 and an X-axis driving stage 112 for supporting and moving the substrate chuck 130, and a base stage 150 on which the X-axis driving stage 112 and the Y-axis driving stage 113 are formed.

The lighting device 101 generates light such as ultraviolet rays or X-rays thereby to transfer a mask pattern onto a substrate.

The mask stage 105 is composed of a lower stage 103 to which the mask 110 is directly coupled, and an upper stage 102 for supporting the lower stage and serving as a base of the mask stage.

In order for the mask 110 to be proximate to the substrate 114 as much as possible, the lower stage 103 to which the mask is directly coupled is coupled to a lower surface of the upper stage 102 thus to support the mask 110.

Each middle portion of the upper stage 102 and the lower stage 103 is empty so that light generated from the lighting device 101 can be irradiated onto the substrate 114 through the mask 110.

Four edges of the mask stage 105 are supported by the supporter 120 of a bar shape.

The substrate 114 supported by the substrate chuck 130, and the Y-axis driving stage 113 and the X-axis driving stage 112 for moving the substrate chuck 130 are installed below the mask stage 105.

The X-axis driving stage 112 can be installed on the base stage 150, or can be installed on a supporting chuck (not shown) formed on the base stage 150. A rail is installed on the base stage 150 or the supporting chuck in an X-axis direction, and the X-axis driving stage 112 is coupled onto the rail. A rail is installed on the X-axis driving stage 112 in a Y-axis direction, and a Y-axis driving stage 113 is coupled onto the rail.

The substrate chuck 130 is installed on the Y-axis driving stage 113, and the substrate 114 loaded onto the substrate chuck 130 is moved to a certain coordinate by the X-axis driving stage 112 and the Y-axis driving stage 113. Generally, a mask has a size larger than that of a substrate. Therefore, a plurality of exposures are performed by moving the substrate under a state that the mask is fixed, thereby transferring a mask pattern onto the entire substrate.

In the exposing apparatus for transferring minute mask patterns onto the substrate, the mask stage and the substrate have to be correctly aligned. Accordingly, an alignment camera (not shown) for a correct alignment between the substrate and the mask stage is provided on the mask stage. Also, an alignment key detected by the alignment camera is installed on the substrate or the X-axis driving stage.

The alignment camera certifies the alignment key thus to correctly align the substrate and the mask stage.

However, the conventional method for aligning the substrate and the mask stage has a problem. That is, since the substrate is moved by the X-axis driving stage 112 and the Y-axis driving stage 113 at the time of aligning the substrate and the mask stage, there is a limitation in aligning the substrate and the mask stage for a unit less than micro-meter.

Furthermore, since the substrate chuck is positioned on the X-axis driving stage and the Y-axis driving stage and the substrate to be exposed is placed on the substrate chuck, there is a limitation in obtaining a minute flatness of the substrate. In the proximity type exposing apparatus, a correct alignment of the substrate and the mask and a minute gap maintenance therebetween are very important.

SUMMARY

An exposing apparatus comprises a mask stage, a supporter that supports the mask stage, a substrate below the mask stage, and a substrate chuck that supports the substrate. The exposing apparatus further comprises a substrate chuck moving mechanism that moves the substrate chuck, a gap motor unit installed on the substrate chuck moving mechanism that controls a gap between the substrate and the mask stage, and a substrate chuck flatness maintaining mechanism that maintains a flatness of the substrate chuck.

In another aspect of the present invention, an exposing apparatus, comprises a substrate chuck, a gap motor unit that moves the substrate chuck up and down, a plurality of flatness maintaining mechanism that maintains a flatness of the substrate chuck, and a substrate chuck flatness detecting mechanism that detects a flatness of the substrate chuck.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Reference will now be made in detail to the preferred embodiments of the present invention, examples of which are illustrated in the accompanying drawings.

Hereinafter, we will describe a proximity type exposing apparatus according to the present invention accompanying drawings.

Figure 1:
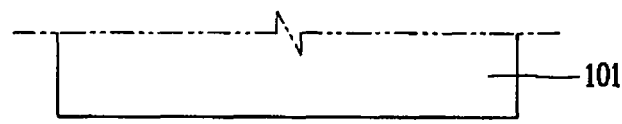
FIG. 1 is a sectional view showing a proximity type exposing apparatus in accordance with the conventional art.
Figure 1:
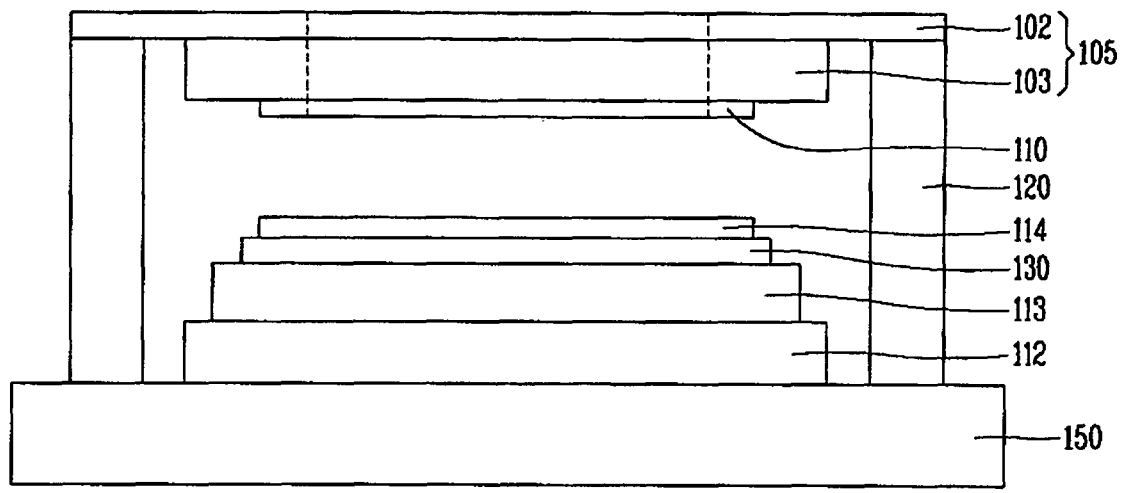
Figure 2:
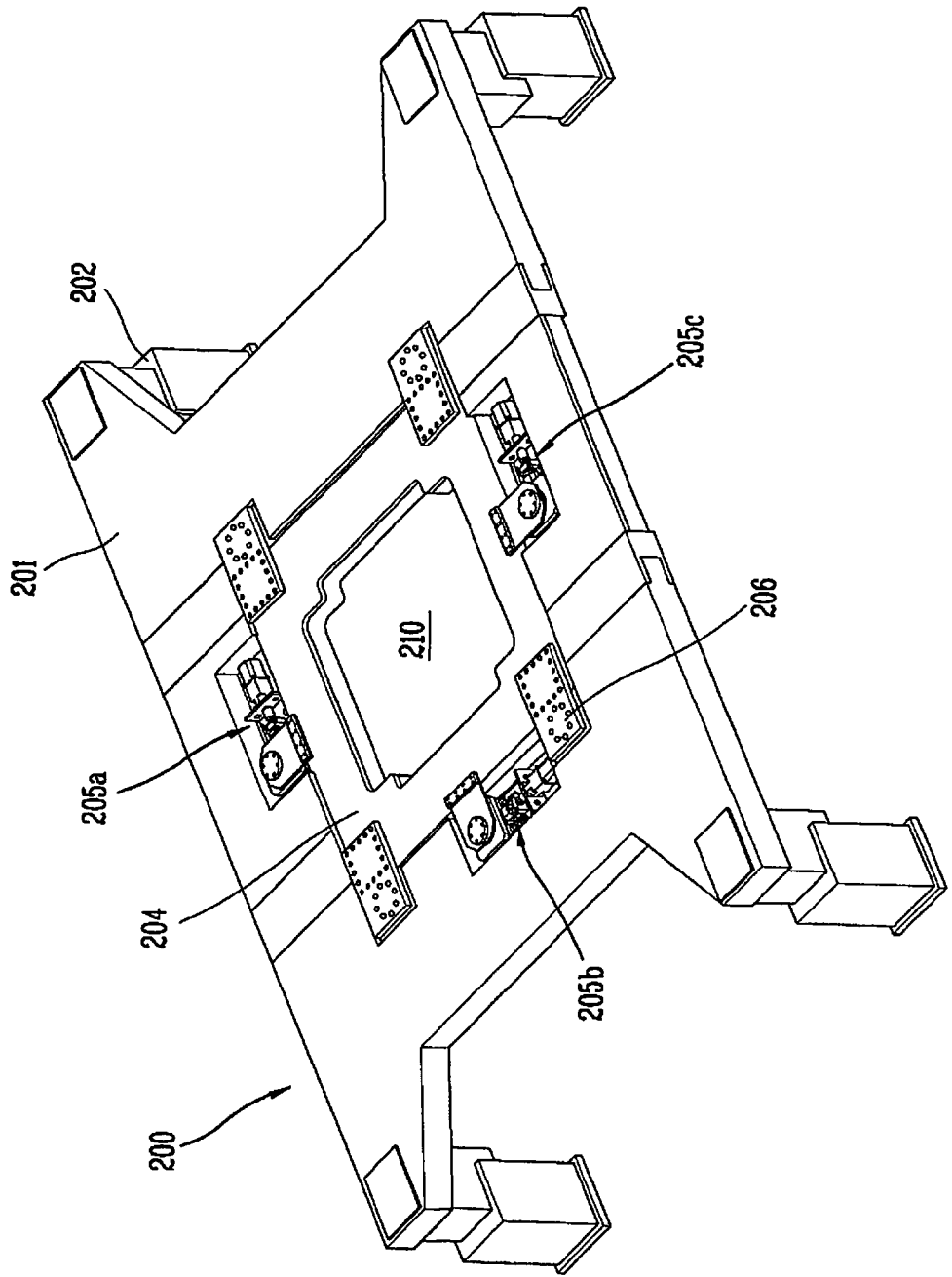
FIG. 2 is a perspective view showing a mask stage of a proximity type exposing apparatus according to the present invention.
Figure 3:
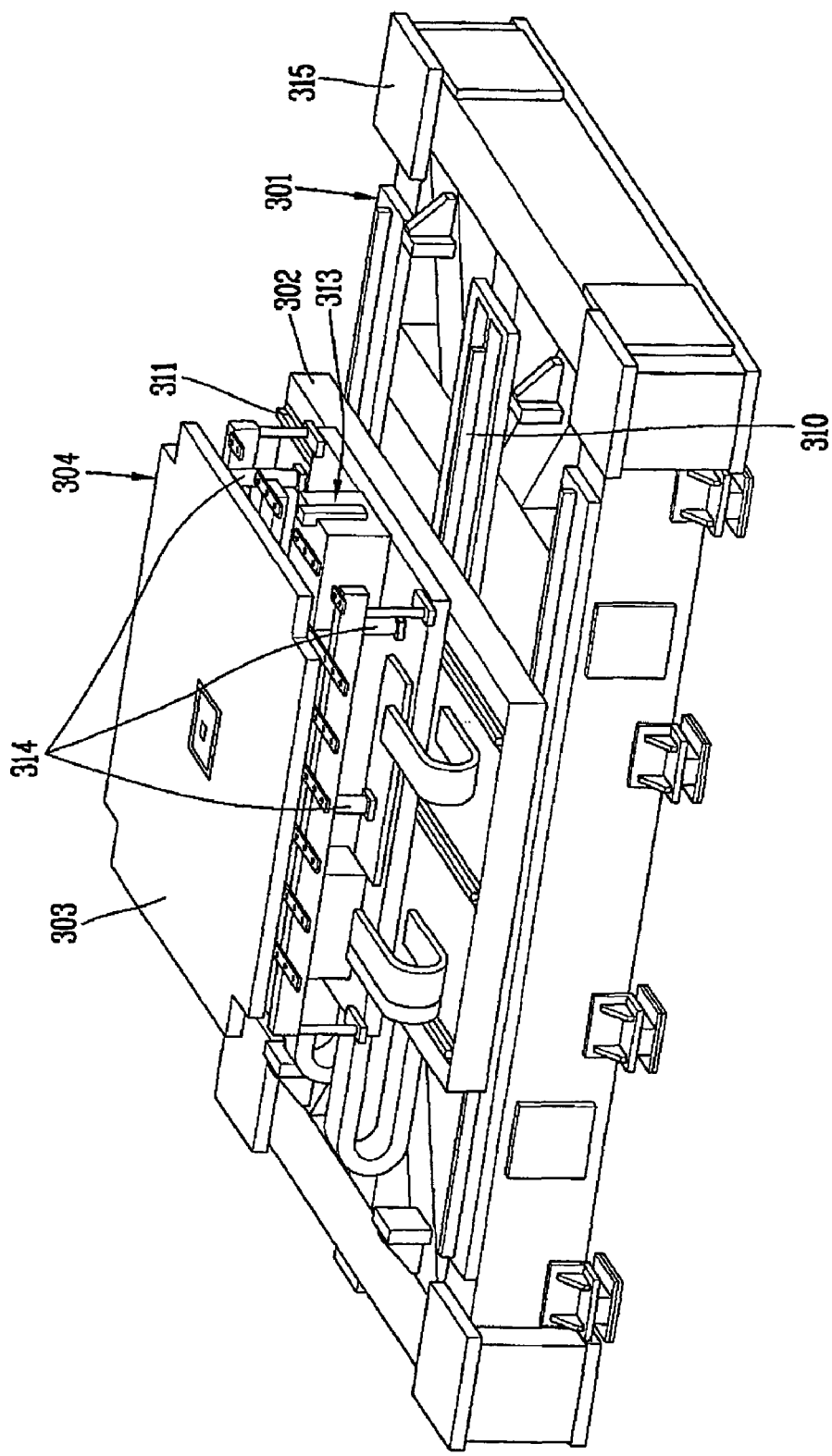
FIG. 3 is a perspective view showing a lower device including a substrate chuck of the proximity type exposing apparatus according to the present invention.

FIGS. 2 and 3 are the views showing a mask stage and a base stage.

Referring to FIG. 2, a mask stage 200 of the present invention comprises a mask base stage 201 having a square shape; a mask fixing stage 204 formed in the middle of the base stage 201 for fixing a mask 210; a supporter 202 formed at an edge of the mask base stage 201 for supporting the mask base stage 201; a weight supporter 206 for overcoming a weight of the mask fixing stage 204 and connecting the mask fixing stage 204 and the mask base stage 201 to each other; and a plurality of guide units 205a, 205b, and 205c for minutely moving the mask fixing stage 204.

The mask base stage 201 of the mask stage 200 has a square shape. The supporter 202 for supporting the mask stage 200 is installed at four edges of the mask base stages 201.

The supporters 202 can be four pillars formed at four edges of the mask base stage, and are constructed to control a height of the mask stage 200. The supporter 202 is connected to the mask base stage 201 of the proximity type exposing apparatus.

The mask fixing stage 204 is installed at an empty space in the middle of the mask base stages 201. The mask fixing stage 204 also has an empty space therein, and the mask 210 is installed at the empty space. Light from a lighting device (not shown) is irradiated onto a substrate through the mask 210.

The proximity type exposing apparatus of the present invention is suitable to expose an LCD panel having a large area, in which a large mask is used. Therefore, the mask fixing stage 204 for fixing the mask is also large and is formed of a metal material, which has a considerable weight of a ton unit. Accordingly, a weight supporter 206 for supporting the weight of the mask fixing stage 204 and connecting the mask fixing stage 204 to the mask base stage 201 is provided.

At least one weight supporter 206 is formed at each edge of the mask fixing stage 204. One portion of the weight supporter 206 is coupled to the mask fixing stage 204 by a coupling means, and another portion thereof is connected to the mask base stage 201 under a state that a ball bearing is interposed therebetween. More concretely, the weight supporter 206 is constructed so as to be minutely movable on the mask base stage 201 by directly coming in contact with the ball bearing formed on the mask base stage 201.

A guide unit for guiding the mask fixing stage in X, Y, and $\ominus$ directions is installed on the base stage, thereby minutely moving the mask fixing stage in X, Y, and $\ominus$ directions thus aligning the mask fixing stage and the substrate.

A plurality of alignment keys for correctly aligning the mask fixed on the mask stage and the substrate installed on the base stage are provided on the substrate or a substrate driving stage. Also, an alignment camera for detecting the alignment keys is provided at the mask stage. The alignment of the substrate and the mask is detected by the alignment camera, and the mask is minutely aligned with the substrate using the guide unit.

Since the mask stage is fixed by the supporter 202, a substrate driving means for moving the substrate for a correct alignment between the mask and the substrate is required.

The substrate is installed on the base stage provided below the mask stage. Hereinafter, the substrate driving means installed on the base stage and the substrate chuck for supporting the substrate will be explained with reference to FIG. 3.

Referring to FIG. 3, a substrate chuck 304 and substrate driving means 302 and 303 provided below the mask stage are formed on a base stage 301 of the proximity type exposing apparatus. A supporter installing unit 315 having a square shape for installing the supporter 202 to support the mask stage is formed at four edges of the base stage 301. The supporter 202 is installed at the supporter installing unit 315 thus to be driven up and down, thereby firstly determining a gap between the mask and the substrate.

The substrate driving means 302 and 303 for moving the substrate are installed on the base stage 301. The substrate driving means 302 is an X-axis driving stage 302 for driving the substrate chuck 304 in an X-direction, and the substrate driving means 303 is a Y-axis driving stage 303 for driving the substrate chuck 304 in a Y-direction. The X-axis driving stage 302 is coupled to an X-axis driving rail 310 formed on the base stage 301 thus to be moved in an X-axis direction, and the Y-axis driving stage 303 is coupled to a Y-axis driving rail 311 formed on the X-axis driving stage 302 thus to be moved in a Y-axis direction.

The substrate chuck 304 installed on the Y-axis driving stage 303 is moved in X and Y directions by the X-axis driving stage 302 and the Y-axis driving stage 303 thus to be moved to a certain coordinate. Since the mask is fixedly installed at the mask stage, the substrate below the mask is moved to be aligned with the mask and then an exposure process is performed.

The substrate chuck 304 for supporting the substrate is formed on the Y-axis driving stage 303. The substrate chuck 304 is provided with a gap motor unit 313 for minutely controlling a gap between the mask and the substrate. Three gap motor units installed with a triangular shape support the substrate chuck 304. The first purpose of the gap motor unit 313 is to constantly maintain a gap between the substrate and the mask in several hundred micrometers range of a high minuteness, and thus three gap motor units are provided. The gap between the substrate and the mask is firstly controlled by the thee gap motor units, and then a flatness of the substrate is controlled by two gap motor units and then by one gap motor unit.

The gap between the mask and the substrate is firstly controlled by the supporter 202 for supporting the mask stage, and then is minutely controlled by the gap motor unit 304 in several hundred micrometers range.

As an image display device such as an LCD device and a PDP device becomes larger, a substrate and a substrate chuck also become larger.

Since a large glass substrate has a size of several meters, a substrate chuck for supporting the substrate has a size of several meters. The substrate chuck is formed of a metal material thus with a heavy weight of several tons. When the substrate chuck 304 is supported by the gap motor unit 313, parts of the substrate chuck 304 that are not supported by the gap motor unit 313 are deflected and thus a uniform flatness is not maintained. In order to prevent the deflection of the substrate chuck, the substrate chuck can be formed to be thicker. However, in this case, the substrate chuck becomes heavier thus not to be smoothly operatable.

Accordingly, the present invention is further provided with a substrate chuck flatness maintaining means 314 for constantly maintaining a gap between the substrate chuck and the mask.

As one example of the substrate chuck flatness maintaining means, a plurality of floating air cylinders 314 are installed below the substrate chuck thus to prevent a deflection of the substrate chuck at each position.

In the proximity type exposing apparatus of the present invention, a substrate chuck flatness detecting means (not shown) for detecting a flatness of the substrate chuck is further installed on the mask stage. The substrate chuck flatness detecting means detects a flatness of the substrate chuck. Then, if the flatness of the substrate chuck is changed according to a position change, the substrate chuck flatness detecting means feeds back the information to a controller. Accordingly, the substrate can have a certain flatness by the floating air cylinder 314.

Hereinafter, the substrate chuck and the substrate chuck flatness maintaining means will be explained with reference to FIGS. 4A and 4B.

Figure 4A:
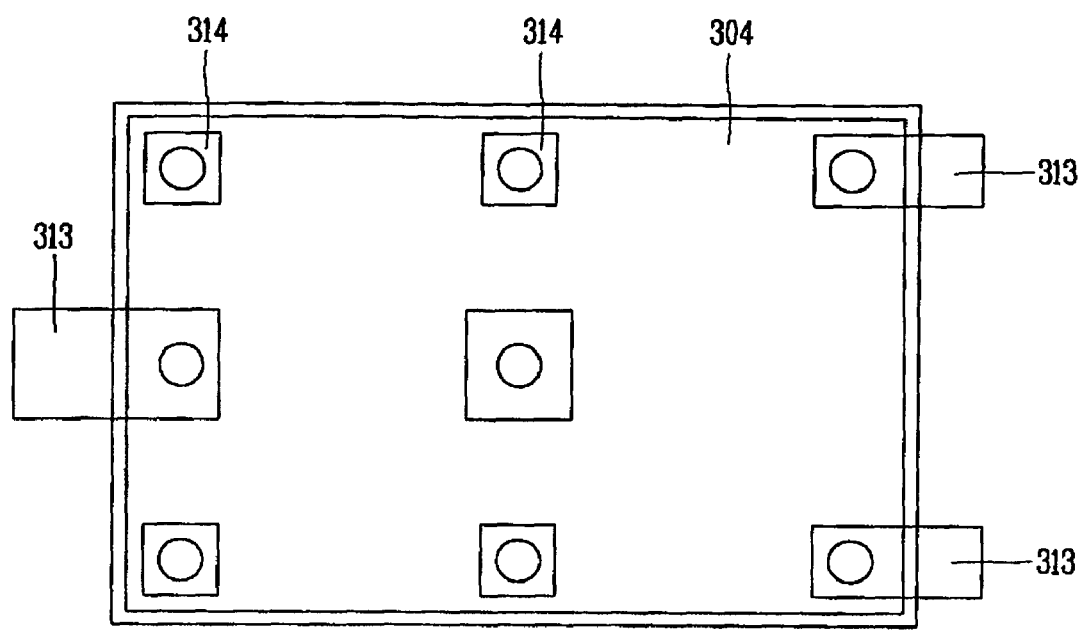
FIGS. 4A and 4B are respectively a plane view and a sectional view of the substrate chuck having a substrate chuck flatness maintaining means according to the present invention.
Figure 4B:
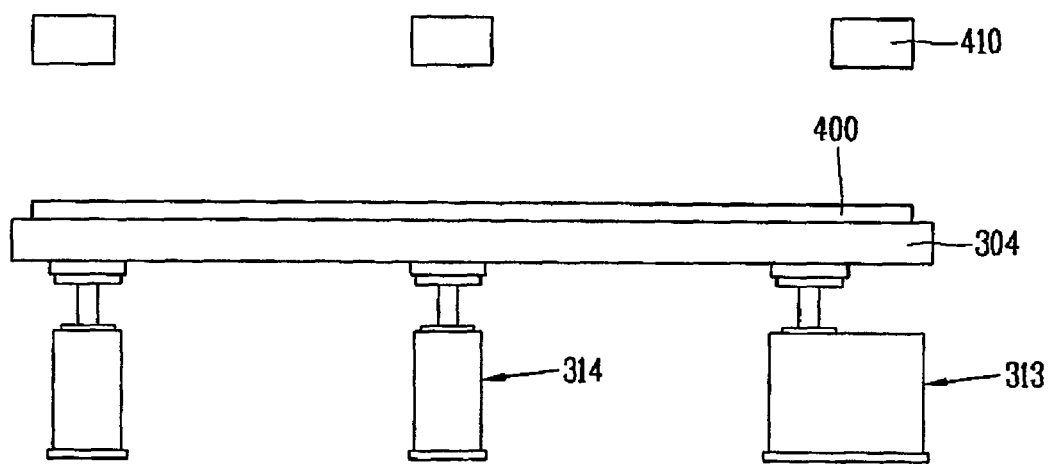

Referring to FIG. 4A, three gap motor units 313 arranged as a triangular shape support the substrate chuck 304 at edges of the substrate chuck 304. The gap motor units 313 lift or lower the substrate chuck 304 thereby to set a gap between the substrate chuck and the mask.

A plurality of floating air cylinders 314 for maintaining a uniform flatness of the substrate chuck are formed at a lower surface of the substrate chuck 304. The floating air cylinders are installed at positions where the substrate chuck can be easily deflected. For instance, when the gap motor units 313 are installed at each edge of the substrate chuck 304, the deflection of the substrate chuck is easily generated at a middle portion and at positions far from the gap motor units 313. Therefore, the air cylinders 314 are installed at the middle portion and at the positions far from the gap motor units 313. Referring to FIG. 4A, three air cylinders 314 are installed in the middle of the substrate chuck 304 with a certain gap therebetween and two air cylinders 314 are installed at each corner of the edge of the substrate chuck 304 where one gap motor unit 313 is installed, so that five air cylinders 314 are totally installed.

Hereinafter, the operation of the floating air cylinder will be explained with reference to FIG. 4B.

A plurality of detecting sensors 410 are installed at the mask stage for supporting the mask. The detecting sensors 410 detect a flatness of the substrate chuck 304, and transmit a signal to a controller (not shown) if the substrate chuck is deflected. Then, the controller transmits the signal to the air cylinders 314 thus to control an air pressure of the air cylinders. As the result, the air cylinders 314 support the substrate chuck 304 with being lifted or lowered, thereby constantly maintaining a flatness of the substrate chuck. An operator sets an initial pressure value of the air cylinder by which the flatness of the substrate chuck is maintained. Then, if the flatness of the substrate chuck detected by the substrate chuck detecting means is changed, the information is sent to the air cylinder and thus the air cylinder is controlled to have the initial pressure value. The present invention is further provided with an electronic regulator for constantly maintaining a pressure of the air cylinder by receiving deflection information of the substrate chuck from the controller.

Figure 5:
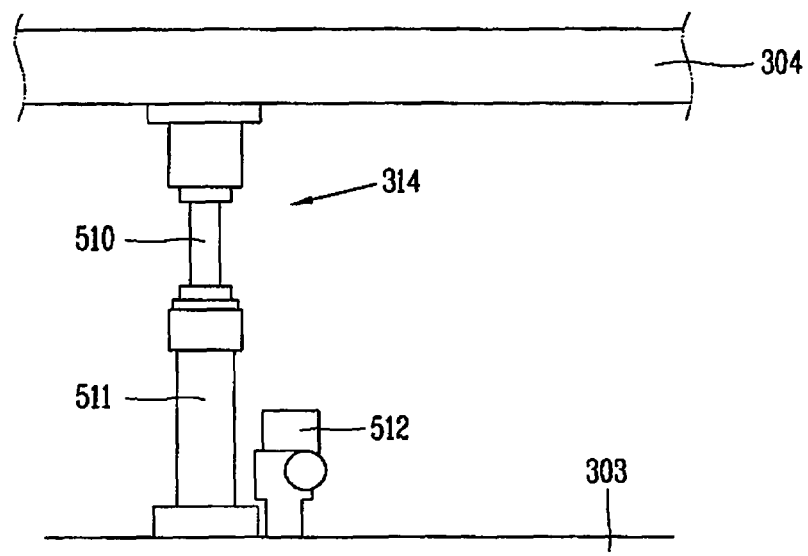
FIG. 5 is an enlarged sectional view showing the substrate chuck flatness maintaining means according to the present invention.

Referring to FIG. 5, the electronic regulator 314 is provided with a piston 510 and a cylinder 511, and can be further provided with supporters respectively contacting the substrate chuck 304 and the Y-axis driving stage 303 at upper and lower portions thereof. Air is filled between the piston 510 and the cylinder 511, and a pressure of the air can be constantly maintained by the electronic regulator 314 installed at each air cylinder 304.

A substrate supporting pin chuck having a substrate supporting pin for unloading a substrate that has been loaded onto the substrate chuck 304 from the substrate chuck by a certain height is further provided below the substrate chuck 304. The supporting pin unloads the substrate from the substrate chuck by a certain height when the substrate is loaded and unloaded onto/from the substrate chuck by a robot arm.

Hereinafter, the substrate supporting pin and the substrate supporting pin chuck for supporting the substrate supporting pin will be explained with reference to FIG. 6.

Figure 6:
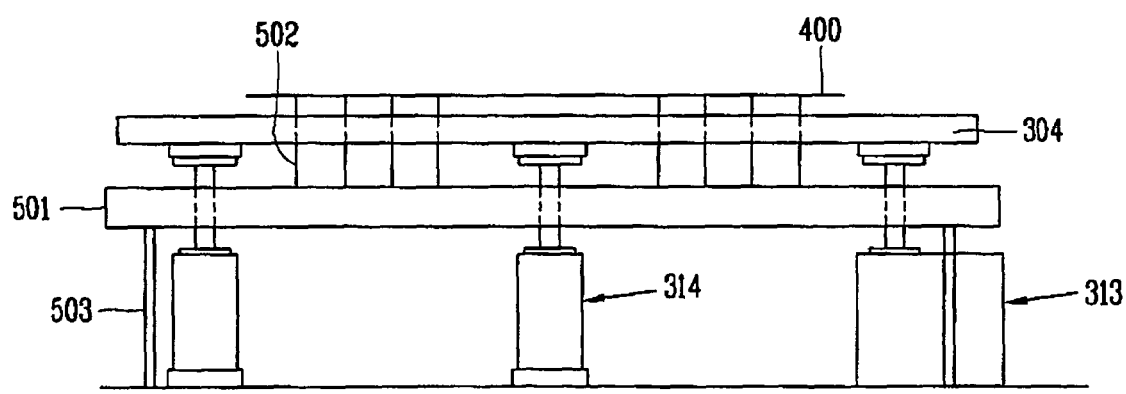
FIG. 6 is a sectional view showing the substrate chuck according to the present invention.

Referring to FIG. 6, the substrate chuck 304 is supported by the gap motor unit 313 and the air cylinder 314. Also, a substrate 400 is positioned on an upper surface of the substrate chuck 304.

A substrate supporting pin chuck 501 is further provided below the substrate supporting chuck 304. A plurality of substrate supporting pins 502 are installed at the substrate supporting pin chuck 501 with a certain gap therebetween.

The substrate supporting pins 502 support the substrate via the substrate supporting chuck. The substrate supporting pin chuck 501 is fixed by additional supporting shafts 503.

The air cylinder 314 and the gap motor unit 313 support the substrate chuck 304 via the substrate supporting pin chuck 501.

Since the substrate supporting pin chuck 304 and the substrate supporting pin installed thereon are fixed, the substrate 400 is loaded/unloaded onto/from the substrate chuck 304 by moving the gap motor unit 313 up and down.

As aforementioned, in the present invention, the gap motor unit for approaching the substrate chuck to the mask is provided, thereby setting a gap between the substrate and the mask of a high minuteness and thus enhancing an exposure function.

In case of exposing a large substrate, a flatness maintaining means for preventing the substrate chuck from being deflected is further provided, thereby constantly maintaining a gap between the substrate and the mask at the time of performing a proximate exposure. Furthermore, since the flatness maintaining means is provided, an excellent flatness can be obtained even if the substrate chuck is thin. Accordingly, a mask pattern can be precisely transferred onto the substrate at the time of performing a proximate exposure.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. An exposing apparatus, comprising:
    a mask stage;
    a supporter that supports the mask stage;
    a substrate below the mask stage;
    a substrate chuck that supports the substrate;
    a substrate chuck moving mechanism that moves the substrate chuck;
    three gap motor units installed on the substrate chuck moving mechanism that controls a gap between the substrate and the mask stage; and
    a plurality of air cylinders for supporting the substrate chuck by a certain pneumatic pressure, each of air cylinders controlling the gap between the mask stage and the corresponding area of the substrate to maintain constantly a flatness of the whole area of the substrate chuck,
    wherein the air cylinders are provided in the positions different from the position of the gap motor units so that the air cylinders are apart from the gap motor units in a predetermined distance to support the portion between the areas of the substrate chuck contacted with the gap motor units,
    wherein at least one gap motor unit is disposed along the peripheral area of the substrate chuck and the air cylinders are disposed along the peripheral area and the center area of the substrate chuck,
    wherein the gap motor units are installed on the substrate chuck moving mechanism with a triangular shape, thereby supporting the substrate chuck.

2. The exposing apparatus of claim 1, wherein the substrate chuck moving mechanism comprises an X-axis driving stage that moves the substrate chuck in an X-direction and a Y-axis driving stage that moves the substrate chuck in a Y-direction.

3. The exposing apparatus of claim 1, further comprising an electronic regulator to maintain a pressure of the air cylinder.

4. The exposing apparatus of claim 3, further comprising a substrate chuck flatness detecting mechanism that detects a flatness of the substrate chuck, wherein the electronic regulator maintains a pressure of the air cylinder based on flatness information of the substrate chuck provided from the substrate chuck flatness detecting mechanism.

5. The exposing apparatus of claim 1, further comprising a plurality of substrate supporting pins that supports the substrate.

6. The exposing apparatus of claim 5, wherein a substrate supporting pin chuck on which the plurality of substrate supporting pins are installed is provided below the substrate chuck.

7. The exposing apparatus of claim 6, wherein the plurality of substrate supporting pins support the substrate via the substrate chuck.

8. The exposing apparatus of claim 7, wherein the gap motor units and the substrate chuck flatness maintaining mechanism support the substrate chuck via the substrate supporting pin chuck.

9. The exposing apparatus of claim 8, wherein the substrate supporting pin chuck is fixed, and the substrate is loaded/unloaded onto/from the substrate chuck by moving the gap motor units up and down.

10. The exposing apparatus of claim 1, wherein the mask stage includes:
    a mask base stage;
    a mask fixing stage in the base stage for fixing a mask
    a supporter at an edge of the mask base stage for supporting the mask base stage;
    a weight supporter for overcoming a weight of the mask fixing stage and connecting the mask fixing stage and the mask base stage; and
    a plurality of guide units for minutely moving the mask fixing stage.

* * * * *